United States Patent
Liao

(10) Patent No.: US 10,236,606 B2
(45) Date of Patent: *Mar. 19, 2019

(54) SOCKET WITH REMOVABLE RETAINER ATTACHED TO DEFLECTABLE FIXING SEAT

(71) Applicant: FOXCONN INTERCONNECT TECHNOLOGY LIMITED, Grand Cayman (KY)

(72) Inventor: Fang-Jwu Liao, New Taipei (TW)

(73) Assignee: FOXCONN INTERCONNECT TECHNOLOGY LIMITED, Grand Cayman (KY)

(*) Notice: Subject to any disclaimer, the term of this patent is extended or adjusted under 35 U.S.C. 154(b) by 0 days.

This patent is subject to a terminal disclaimer.

(21) Appl. No.: 15/705,009

(22) Filed: Sep. 14, 2017

(65) Prior Publication Data

US 2018/0076544 A1 Mar. 15, 2018

(30) Foreign Application Priority Data

Sep. 14, 2016 (CN) .................... 2016 2 1054491 U

(51) Int. Cl.
*H05K 1/11* (2006.01)
*H05K 3/30* (2006.01)
*H05K 7/10* (2006.01)
*H01R 12/70* (2011.01)

(52) U.S. Cl.
CPC ..... *H01R 12/7023* (2013.01); *H01R 12/7076* (2013.01); *H05K 1/11* (2013.01); *H05K 7/1061* (2013.01); *H05K 3/301* (2013.01); *H05K 2201/10325* (2013.01); *H05K 2201/10393* (2013.01); *H05K 2201/10409* (2013.01)

(58) Field of Classification Search
CPC ............ H01R 12/7023; H01R 12/7076; H01R 12/88; H05K 2201/10393
See application file for complete search history.

(56) References Cited

U.S. PATENT DOCUMENTS

| | | | | |
|---|---|---|---|---|
| 7,338,308 B2* | 3/2008 | Nakao | .................. | G01R 1/0466 439/331 |
| 7,708,580 B2* | 5/2010 | Yeh | ...................... | H05K 7/1053 439/331 |
| 8,123,543 B1* | 2/2012 | Terhune, IV | ........ | H05K 7/1061 439/331 |

(Continued)

FOREIGN PATENT DOCUMENTS

CN 204947170 U 1/2016
TW M294139 3/2016

*Primary Examiner* — Edwin A. Leon
*Assistant Examiner* — Oscar C Jimenez
(74) *Attorney, Agent, or Firm* — Wei Te Chung; Ming Chieh Chang

(57) ABSTRACT

An electrical connector assembly for connecting a CPU to a printed circuit board, includes an insulative housing, a fixing device and a retainer. The fixing device is located by one end side, and the retainer is used to load the CPU into the housing. The fixing device includes a stationary part and a moveable insertion part wherein the retainer with the CPU therein is retained to the insertion part to commonly rotate about the stationary part for positioning the retainer with the CPU therein within the housing.

20 Claims, 7 Drawing Sheets

(56) References Cited

U.S. PATENT DOCUMENTS

| | | | | |
|---|---|---|---|---|
| 8,142,201 B2* | 3/2012 | Fan | ................... | H05K 7/1007 |
| | | | | 439/135 |
| 8,597,035 B1* | 12/2013 | Terhune, IV | ........ | H05K 7/1061 |
| | | | | 439/331 |
| 10,116,076 B2* | 10/2018 | Liao | ................. | H01R 12/88 |
| 2009/0325404 A1* | 12/2009 | Lin | ................ | H01R 13/2435 |
| | | | | 439/73 |
| 2013/0183849 A1* | 7/2013 | Tsai | ................. | H05K 7/1061 |
| | | | | 439/366 |
| 2013/0322037 A1* | 12/2013 | Tan | ................. | H05K 7/10 |
| | | | | 361/752 |
| 2013/0344713 A1* | 12/2013 | Yeh | ................. | H01R 12/88 |
| | | | | 439/68 |
| 2014/0099816 A1* | 4/2014 | Hsieh | ............. | G01R 1/0466 |
| | | | | 439/331 |
| 2014/0329404 A1* | 11/2014 | Yeh | ................. | H05K 7/1053 |
| | | | | 439/372 |

* cited by examiner

SOCKET WITH REMOVABLE RETAINER ATTACHED TO DEFLECTABLE FIXING SEAT

BACKGROUND OF THE INVENTION

1. Field of the Invention

The present invention relates to an electrical connector assembly, and particularly to the electrical connector with the mechanism for reliably positioning a CPU (Central Processing Unit) in the socket of the connector assembly.

2. Description of Related Art

Chinese Patent No. CN205104653 discloses an electrical connector assembly discloses a discrete retainer holding the CPU to be griped by fingers to be loaded into the socket. Anyhow, there is a potential risk for the fingers to incautiously damage the terminals in the socket. U.S. Pat. Nos. 9,270,035, 9,214,754 and 8,979,565 disclose the rotational type retainer which may prevent the potential risk for not damaging the terminals to incautiously damage the terminals. However, the simplified structure is desired for such rotational type retainer.

SUMMARY OF THE INVENTION

An electrical connector assembly for connecting a CPU to a printed circuit board, includes an insulative housing, a fixing device and a retainer. The fixing device is located by one end side, and the retainer is used to load the CPU into the housing. The fixing device includes a stationary part and a moveable insertion part wherein the retainer with the CPU therein is retained to the insertion part to commonly rotate about the stationary part for positioning the retainer with the CPU therein within the housing.

BRIEF DESCRIPTION OF THE DRAWINGS

FIG. 6 is a perspective view of the combination shown in FIG. 4 wherein the retainer associated with the CPU is received in the.

DETAILED DESCRIPTION OF THE PREFERRED EMBODIMENT

Reference will now be made in detail to the preferred embodiment of the present invention.

Figure 1:
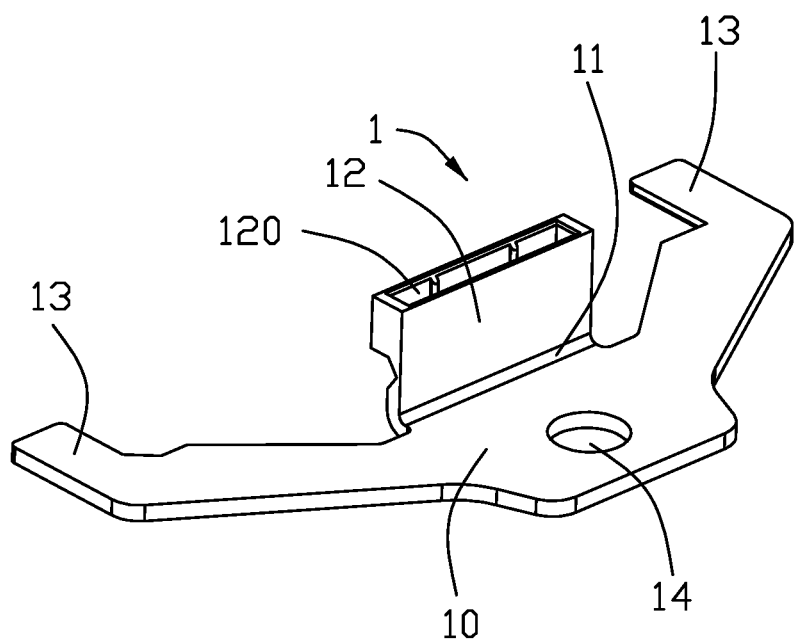
FIG. 1 is a perspective view of the fixing device of an electrical connector assembly according to the presently preferred embodiment of the invention.
Figure 2:
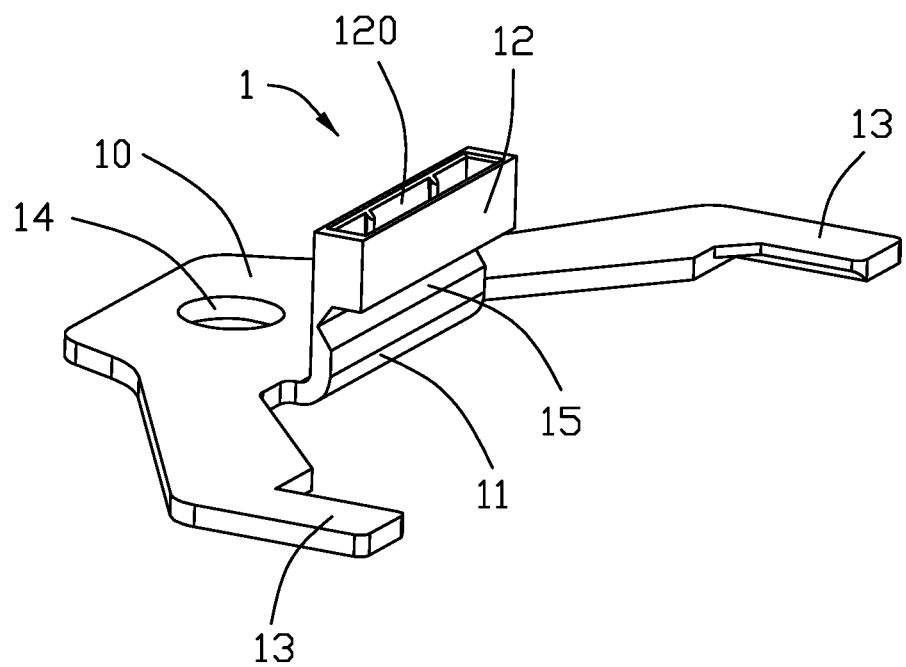
FIG. 2 is another perspective view of the electrical connector assembly of FIG. 1.
Figure 3:
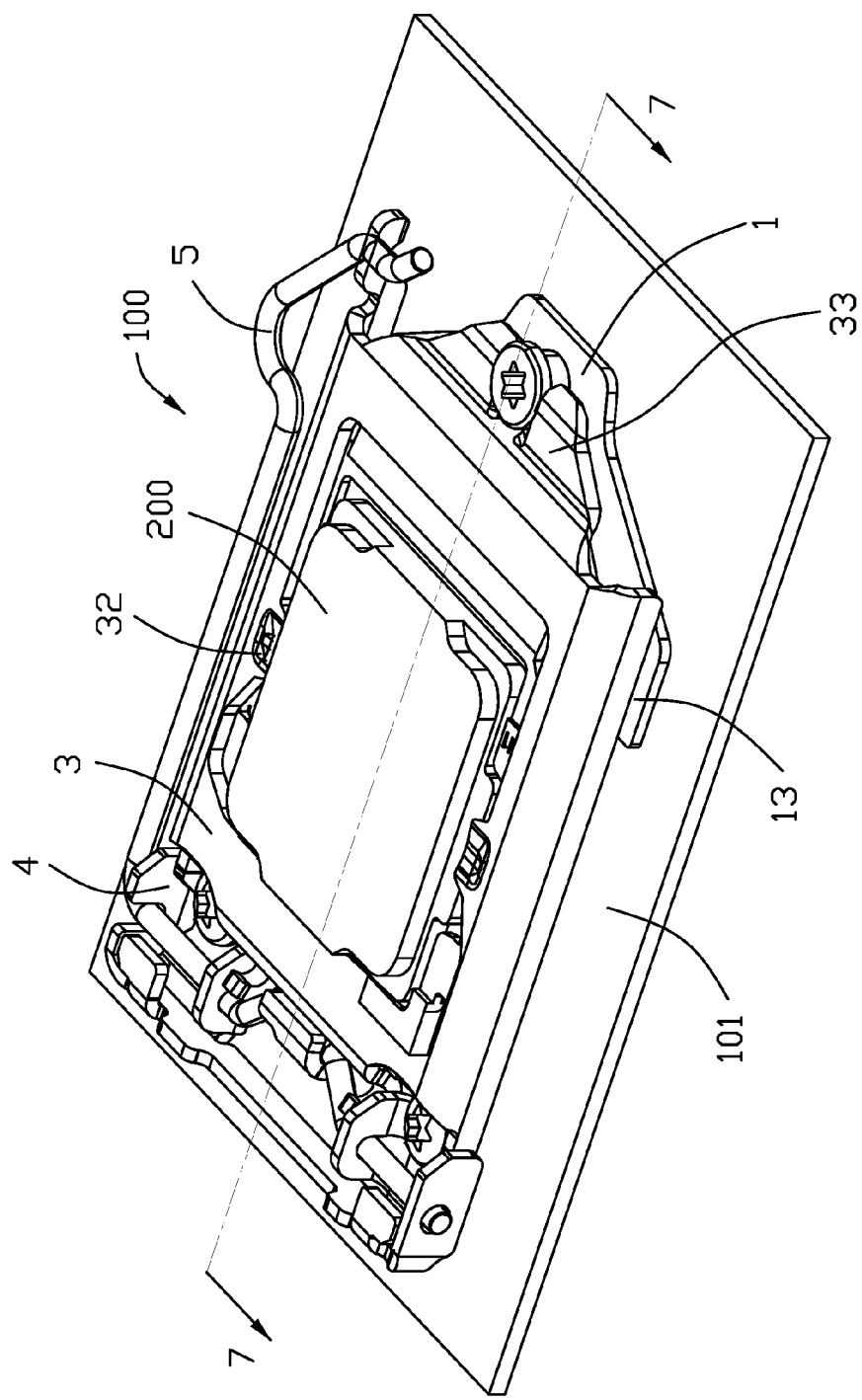
FIG. 3 is perspective view of the electrical connector assembly of FIG. 1 mounted upon a printed circuit board and receiving a CPU therein.
Figure 4:
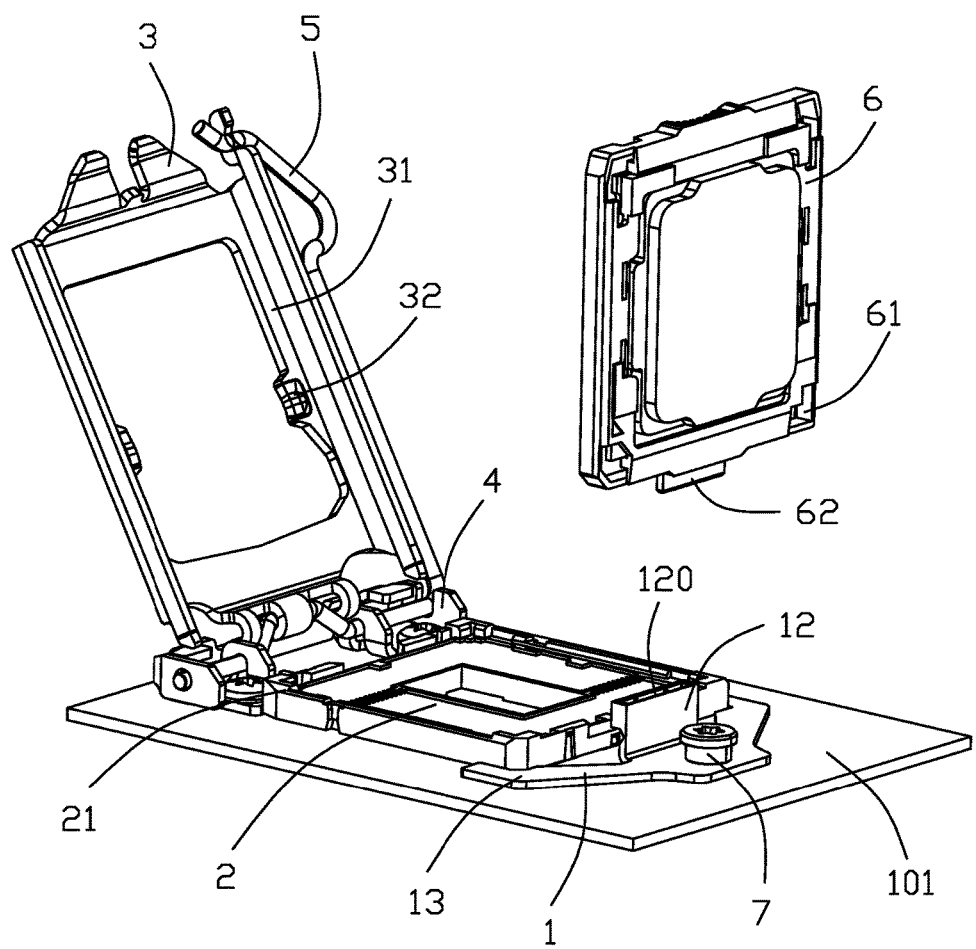
FIG. 4 is an exploded perspective view of the combination shown in FIG. 3 wherein the retainer is detached from the fixing device.
Figure 5:
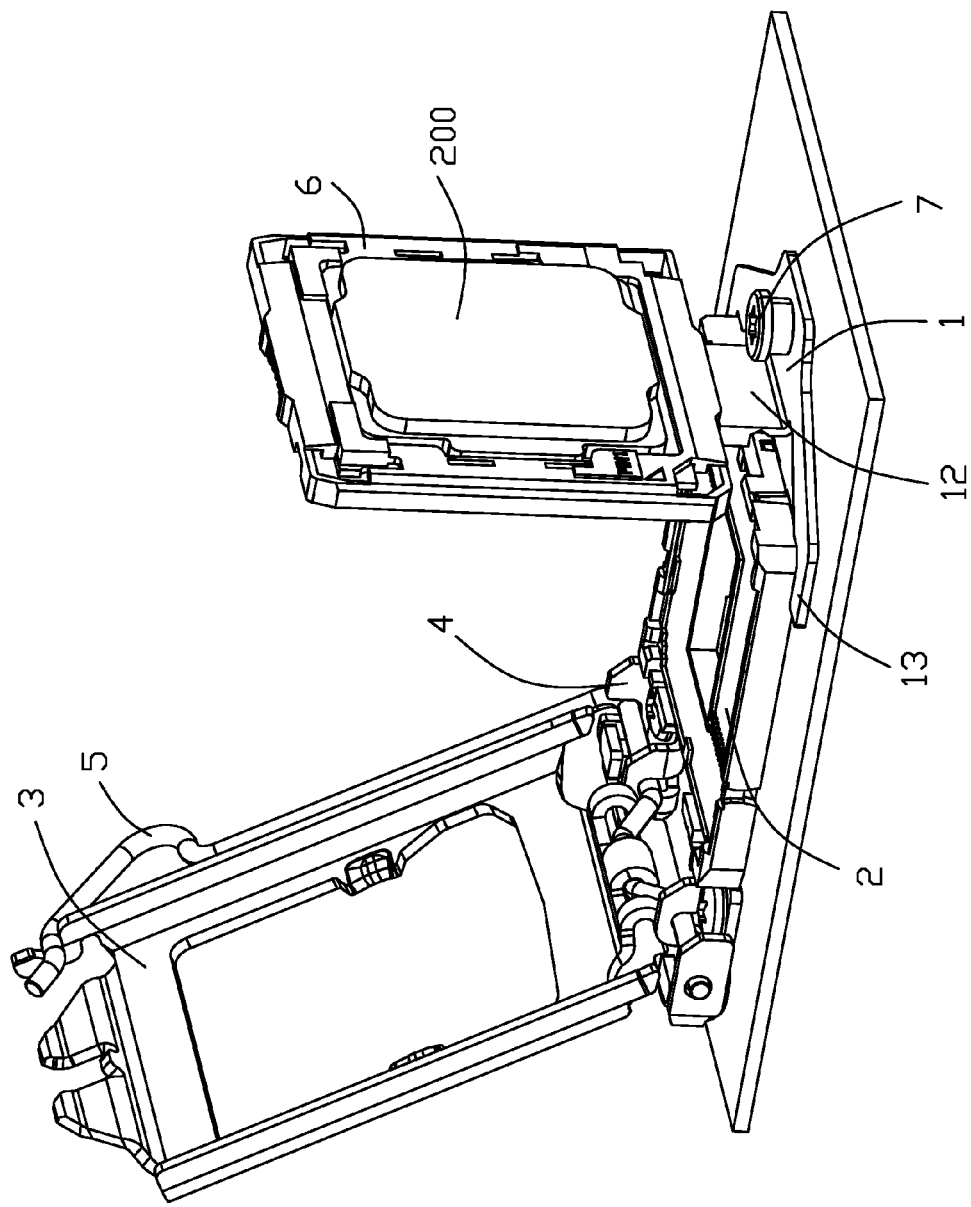
FIG. 5 is a perspective view of the combination shown in FIG. 4 wherein the retainer is assembled upon the fixing device in an open manner.
Figure 6:
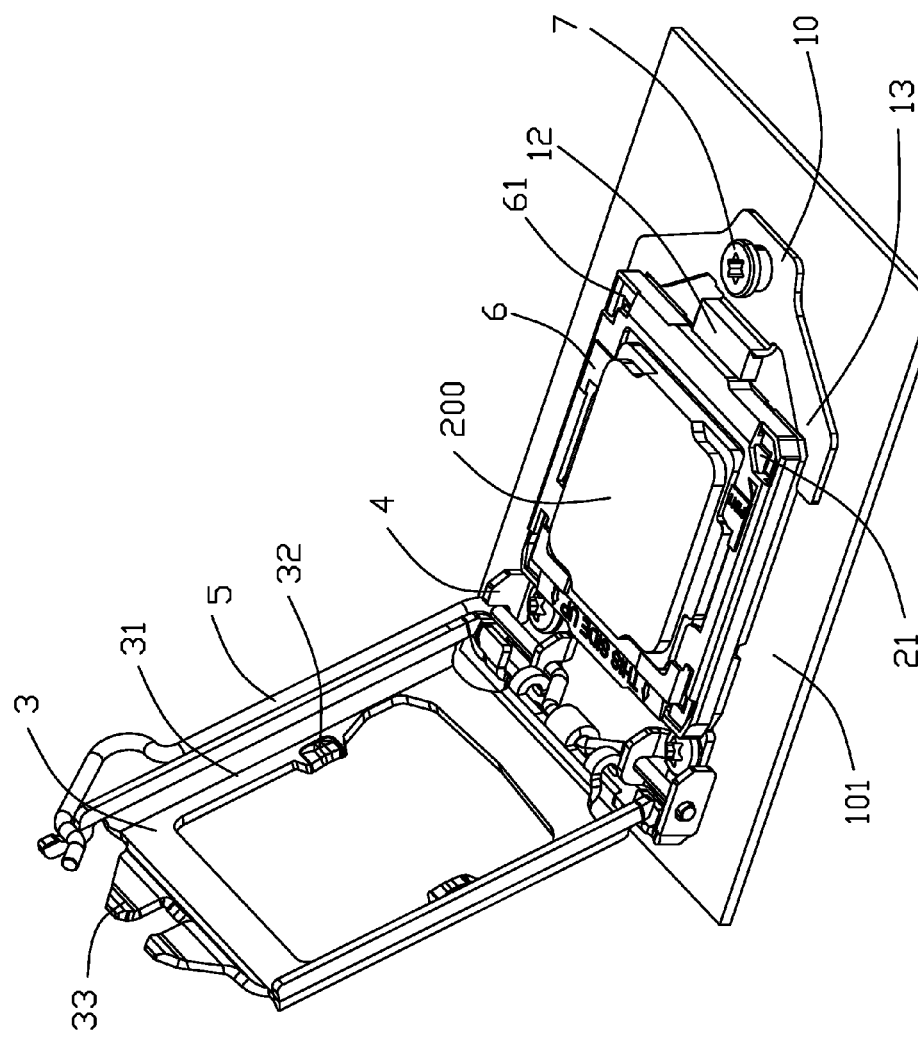
Figure 7:
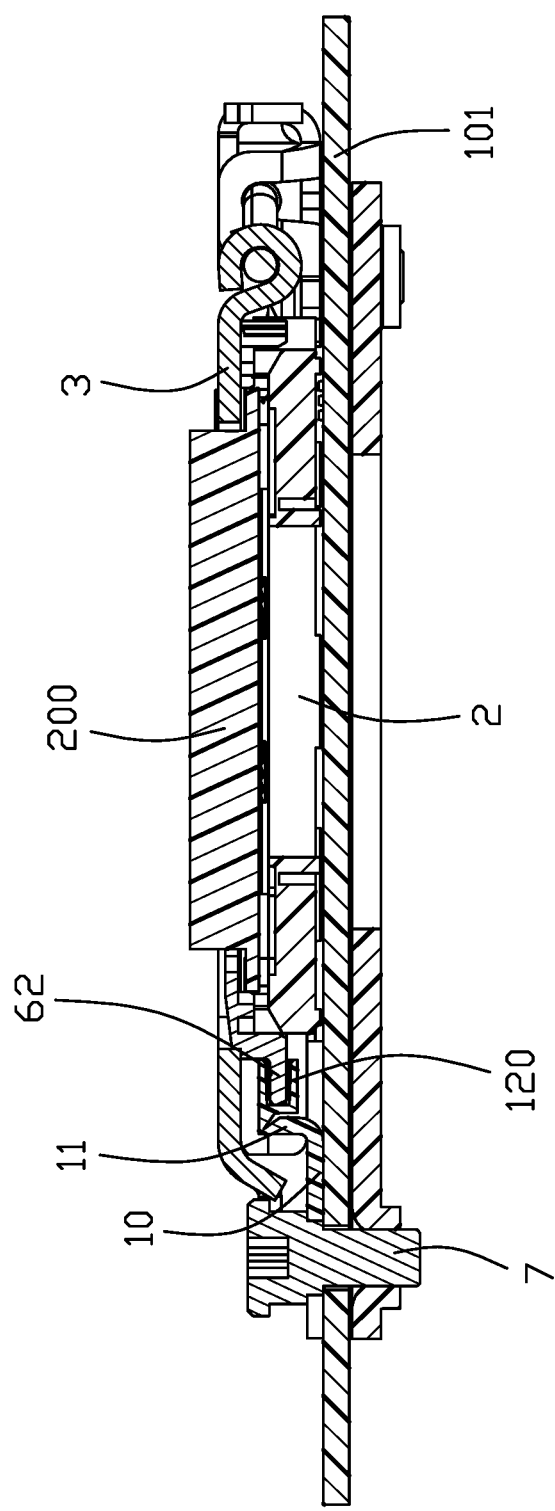
FIG. 7 is a cross-sectional view of the combination shown in FIG. 4 wherein the retainer associated with the CPU is secured in position by the load plate.

Referring to FIGS. 1-7, a fixing device 1 is mounted upon the printed circuit board 101 and includes stationary part 10, a moveable insertion/attachment part 12 and a linking portion 11 therebetween wherein the insertion part 12 is moveable relative to the stationary part. The insertion part 12 has a receiving slot 120. In this embodiment, the fixing device 1 is made of plastic. A V-shaped cut 15 is formed between the linking portion 11 and the insertion part 12 so as to allow the insertion part 12 to be back and forth moveable between a horizontal position and an upstanding position. The fixing device 1 further includes a pair of side arms 13 located by two lateral sides of the housing 2.

An electrical connector assembly 100 including the fixing device 1, is used to connect a CPU 200 to a printed circuit board 101. The electrical connector assembly 100 further includes an insulative housing 2, a securing station 4 with a pivotal lever 5 thereon, and a load plate/cover 3 pivotally mounted upon the pivotal lever 5, and a retainer 6 retaining the CPU 200 and located between the cover 3 and the housing 2 for positioning the CPU 200 in the housing 2. The securing station 4 and the fixing device 1 are respectively located by two opposite end sides of the housing 2 in the front-to-back/longitudinal direction. In this embodiment, the distance between the pair of side arms 13 is similar to the transverse dimension of the housing 2 for sandwiching the housing 2 therebetween. If necessary, the side arms 13 may abut against housing 2 in the vertical direction furthermore.

The insulative housing 2 received a plurality of terminals (not shown) therein and forms blocks 21 for retraining the CPU 200. The retainer 6 forms holes 61 to expose/receive the blocks 21 and the inserting plate 62. By cooperation of the holes 61 and the blocks 21 to guide the retainer 6 with the associated CPU 200 to be assembled into the housing 2, and the inserting plate 62 is inserted into the insertion part 12 to assembled the retainer 6 to the fixing device 1.

The cover 3 includes a frame 31 with a pair of pressing sections 32 thereon pivotally mounted upon the securing station 4 via the rotational lever 5 at one end, and a locking section 33 at the other end wherein the lever 5 rotatable with regard to the securing station 4, and the cover 3 is rotatable with regard to the lever 5. The pressing section 32 are used to press downward the CPU 200. A securing knob 7 not only fixes the fixing device 1 upon the printed circuit board 101 but also cooperates with the locking section 33 to secure the cover 3 in position. In this embodiment, the securing knob is a rivet. Notably, the securing station 4 can be of a frame structure to surround the housing 2, and the fixing device 1 may be secured to the securing station 4.

During operation, the insertion part 12 is in the upstanding position around one end side, and the cover 3 and the lever 5 are in the upstanding position around the other end side. The CPU 200 is assembled to the retainer 6 in a retained manner. The inserting plate 62 is inserted into the receiving slot 120. The inserting plate 62 of the retainer 6 is rotated from the upstanding position to the horizontal position due to existence of the V-shaped cut 15. Understandably, in another embodiment, the deformation of the linking portion 11 may replace the V-shaped cut 15. The cover 3 is downwardly rotated to the horizontal position to be positioned upon the CPU 200, and the lever 5 is successively rotated to the horizontal position to slightly move the cover 3 to move rearwardly so as to have the cover downwardly press the CPU 200 and optionally further downwardly press the retainer 6 wherein the locking section 33 is pressed downwardly by the securing knob 7. Notably, similar to what is disclosed in the aforementioned patens, the lever 5 is locked to the cover 3 in the horizontal position so as to reliably secure the cover 3 to the securing knob 7.

However, the disclosure is illustrative only, changes may be made in detail, especially in matter of shape, size, and arrangement of sections within the principles of the invention.

What is claimed is:

1. An electrical connector assembly for connecting a Central Processing Unit (CPU) to a printed circuit board, comprising:
    an insulative housing defining opposite first and second ends along a front-to-back direction;
    a unitary one-piece fixing device located by the first end and having a stationary part and a movable attachment part;
    a securing station located by the second end;
    a lever pivotally mounted to the securing station;
    a cover being discrete from but pivotally mounted to the lever; and
    a retainer detachably attached upon the attachment part; wherein said retainer is configured to have the CPU attached thereon to be commonly assembled in the housing and downwardly pressed by the cover.

2. The electrical connector assembly as claimed in claim 1, wherein the retainer is made of plastic.

3. The electrical connector assembly as claimed in claim 2, wherein a cut is formed between the stationary part and the attachment part to allow the attachment part to move relative to the stationary part.

4. The electrical connector assembly as claimed in claim 2, wherein a deformable linking portion is located between the stationary part and the movable attachment part to allow the attachment part to move relative to the stationary part.

5. The electrical connector assembly as claimed in claim 1, further including around the first end a securing knob not only securing the fixing device upon the printed circuit board but also locking the cover in a horizontal position.

6. The electrical connector assembly as claimed in claim 5, wherein said fixing device is discrete from the securing knob.

7. The electrical connector assembly as claimed in claim 1, wherein said cover reaches the first end when said cover is in a horizontal position.

8. A combination comprising:
    a printed circuit board;
    an insulative housing positioned upon the printed circuit board and defining opposite first and second ends along a front-to-back direction;
    a unitary one-piece fixing device located by the first end and having a stationary part and a movable attachment part;
    a securing station located by the second end;
    a lever pivotally mounted to the securing station;
    a cover being discrete from but pivotally mounted to the lever;
    a retainer detachably attached upon the attachment part; and
    a CPU (Central Processing Unit) attached to the retainer; wherein the retainer with the associated CPU is initially assembled in the housing in a rotational manner when the cover is in an upstanding state, and the CPU successively is downwardly pressed by the cover when the cover is moved to a horizontal position.

9. The combination as claimed in claim 8, wherein the retainer is made of plastic.

10. The combination as claimed in claim 9, wherein a cut is formed between the stationary part and the attachment part to allow the attachment part to move relative to the stationary part.

11. The combination as claimed in claim 9, wherein a deformable linking portion is located between the stationary part and the movable attachment part to allow the attachment part to move relative to the stationary part.

12. The combination as claimed in claim 8, further including around the first end a securing knob not only fixing the fixing device upon the printed circuit board but also locking the cover in said horizontal position.

13. The electrical connector assembly as claimed in claim 12, wherein said fixing device is discrete from the securing knob.

14. The combination as claimed in claim 8, wherein said cover reaches the first end when said cover is moved to the horizontal position.

15. An electrical connector assembly for connecting a Central Processing Unit (CPU) to a printed circuit board, comprising:
    an insulative housing defining opposite first and second ends along a front-to-back direction;
    a plastic fixing device located by the first end and having a stationary part and a movable attachment part;
    a securing station located by the second end;
    a lever pivotally mounted to the securing station;
    a cover being discrete from but pivotally mounted to the lever; and
    a retainer detachably attached upon the attachment part; wherein said retainer is configured to have the CPU attached thereon to be commonly assembled in the housing and downwardly pressed by the cover.

16. The electrical connector assembly as claimed in claim 15,
    wherein a cut is formed between the stationary part and the attachment part to allow the attachment part to move relative to the stationary part.

17. The electrical connector assembly as claimed in claim 15, wherein a deformable linking portion is located between the stationary part and the movable attachment part to allow the attachment part to move relative to the stationary part.

18. The electrical connector assembly as claimed in claim 15, further including around the first end a securing knob not only fixing the fixing device upon the printed circuit board but also locking the cover in a horizontal position.

19. The electrical connector assembly as claimed in claim 18, wherein said fixing device is discrete from the securing station knob.

20. The electrical connector assembly as claimed in claim 15, wherein the cover reaches the first end when said cover is in a horizontal position.

* * * * *